(12) United States Patent
Kim

(10) Patent No.: US 7,526,688 B2
(45) Date of Patent: Apr. 28, 2009

(54) PARALLEL BIT TESTING DEVICE AND METHOD

(75) Inventor: Hong-Beom Kim, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 585 days.

(21) Appl. No.: 11/126,572

(22) Filed: May 10, 2005

(65) Prior Publication Data
US 2005/0257107 A1 Nov. 17, 2005

(30) Foreign Application Priority Data
May 11, 2004 (KR) .............. 10-2004-0033166

(51) Int. Cl.
*G11C 29/00* (2006.01)
(52) U.S. Cl. .............................. 714/718
(58) Field of Classification Search ............. 714/718, 714/719
See application file for complete search history.

(56) References Cited

U.S. PATENT DOCUMENTS

| | | | |
|---|---|---|---|
| 4,296,494 A * | 10/1981 | Ishikawa et al. ......... 714/6 |
| 6,496,429 B2 | 12/2002 | Murai et al. |
| 6,681,358 B1 * | 1/2004 | Karimi et al. ......... 714/733 |
| 6,799,291 B1 * | 9/2004 | Kilmer et al. ......... 714/722 |
| 6,920,590 B2 * | 7/2005 | Nakamura ......... 714/703 |
| 7,117,406 B2 * | 10/2006 | Onodera ......... 714/718 |
| 7,249,296 B2 * | 7/2007 | Hirabayashi ......... 714/718 |
| 7,305,597 B1 * | 12/2007 | Andreev et al. ......... 714/719 |
| 7,308,621 B2 * | 12/2007 | Adams et al. ......... 714/718 |

FOREIGN PATENT DOCUMENTS

| | | |
|---|---|---|
| JP | 2000-90693 | 3/2000 |
| JP | 2002-269993 | 9/2002 |
| KR | 1999-0057715 | 7/1999 |
| KR | 2000-0013810 | 3/2000 |
| KR | 2001-37848 | 5/2001 |
| KR | 2001-0037848 | 5/2001 |

OTHER PUBLICATIONS

English language abstract of Korean Publication No. 199-0057715.
English language abstract of Korean Publication No. 2000-0013810.
English language abstract of Korean Publication No. 2001-0037848.
English language abstract of Japanese Publication No. 2002-269993.
English language abstract of Japanese Publication No. 2000-90693.
English language abstract of Korean Publication No. 2001-37848.

* cited by examiner

*Primary Examiner*—James C Kerveros
(74) *Attorney, Agent, or Firm*—Marger Johnson & McCollom, P.C.

(57) ABSTRACT

A memory device includes a memory cell array to store data, a register to store test data, and a decision circuit to invert the test data and to determine a failure of at least one memory cell within the memory cell array responsive to the data, the test data, and the inverted test data.

16 Claims, 5 Drawing Sheets

FIG. 7

| ABCD | abcd | X1,X2,X3,X4 | X5,X6,X7,X8 | Y1 | Y2 | Z | |
|---|---|---|---|---|---|---|---|
| 0010 | 0010 | 0000 | 1111 | 1 | 0 | 1 | PASS |
| | 1101 | 1111 | 0000 | 0 | 1 | 1 | |
| | 0001 | 0011 | 1100 | 0 | 0 | 0 | FAIL |
| | 0011 | 0001 | 1110 | 0 | 0 | 0 | |

PARALLEL BIT TESTING DEVICE AND METHOD

REFERENCE TO RELATED APPLICATIONS

This application claims priority to Korean Patent Application No. 2004-33166, filed on May 11, 2004, which we incorporate by reference.

BACKGROUND OF THE INVENTION

1. Field of the Invention

The present invention relates to memory devices, more particularly, to a parallel bit testing device and method for detecting defective memory cells within memory devices.

2. Description of the Related Art

A typical memory device includes a memory cell array, where each memory cell in the array may store data. To determine which memory cells, if any, are defective, a tester may perform a parallel bit test on the memory cell array. To perform the parallel bit test, the memory device is configured into a parallel bit test mode responsive to a test mode setting command from the tester. The tester writes test pattern data to the memory cell array, where each memory cell is paired with another memory cell and written with the same data. When a read command is provided from the tester, the memory device reads the data from the memory cell array, and compares the data read from each memory cell pair for congruency. The tester determines which pairs include a defective cell responsive to the comparison and replaces those defective pairs with replacement cells. Typically the defective pairs are replaced as units, e.g., the tester replaces a group of four memory cells containing the defective cell with four replacement cells. When both memory cells in a memory cell pair are defective, however, the comparison result may indicate that the memory cells are not defective, and thus the memory device fails to replace the defective memory cells.

In another type of parallel bit test, disclosed in Korean Patent Laid-Open Publication No. 2001-0037848, a memory device stores test pattern data in a test pattern register and compares the test pattern data read from memory cell array with the stored test pattern data to determine which memory cells, if any, are defective. Accordingly, the memory device is able to correctly detect defective memory cells, including the case where both memory cells in a memory cell pair are defective.

To ensure accuracy in the detection of defective memory cells, the parallel bit test is typically performed at least twice on the memory cell array, using the test data pattern and an inverted version of the test data pattern. Accordingly, the memory device and parallel bit test disclosed above requires the sequential storing of inverted and non-inverted test pattern data into the test pattern data register, which complicates and slows testing, and lowers productivity of the memory device. And in some parallel bit testing schemes, some of the memory cells within the array may store the test pattern data while other memory cells may store the inverted test pattern data, thus requiring the test pattern data register to store an increasing number of inverted and non-inverted test patterns.

SUMMARY OF THE INVENTION

A device includes a memory cell array to store data, a register to store test data, and a decision circuit to invert the test data and to determine a failure of at least one memory cell within the memory cell array responsive to the data, the test data, and the inverted test data.

A method includes storing test data in a register, storing data to a memory cell array, inverting the test data from the register, and determining a failure of at least one memory cell within the memory cell array responsive to the data, the test data, and the inverted test data.

BRIEF DESCRIPTION OF THE DRAWINGS

The features and advantages of the present invention will become readily apparent with the detailed description of embodiments of the invention with reference to the accompanying drawings.

FIG. 7 is a truth table illustrating the operation of the decision circuit shown in FIG. 6.

DETAILED DESCRIPTION OF THE INVENTION

Figure 1:
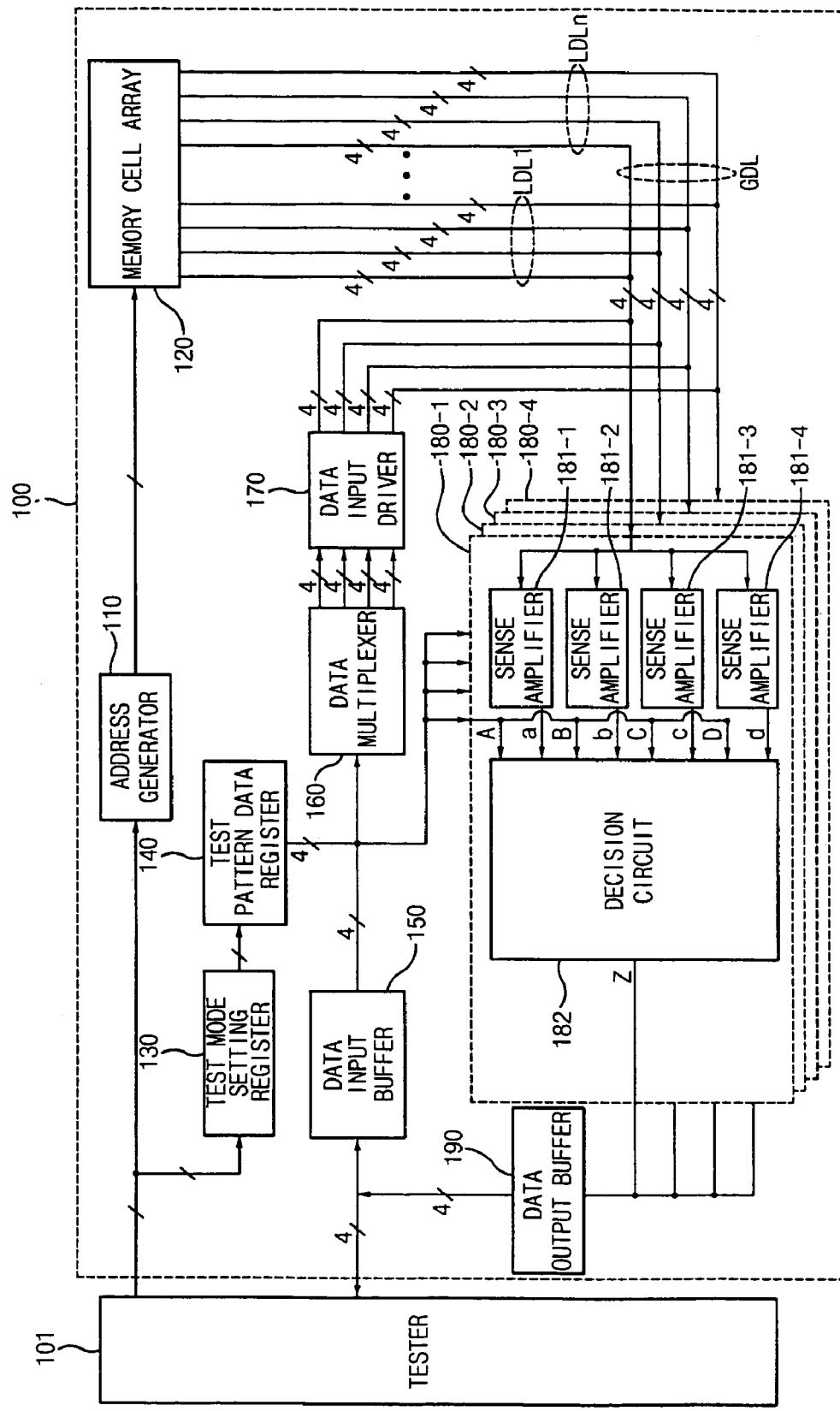
FIG. 1 is a block diagram showing a memory device according to an embodiment of the present invention.

FIG. 1 is a block diagram showing a memory device according to an embodiment of the present invention. Referring to FIG. 1, a system for performing parallel bit test operations includes a tester 101 and a memory device 100. The memory device 100 includes an address generator 110, a memory cell array 120, a test mode setting register 130, a test pattern data register 140, a data input buffer 150, a data multiplexer 160, a data input driver 170, data output circuits 180-1, 180-2, 180-3 and 180-4, and a data output buffer 190.

The tester 101 tests the memory cell array 120 by providing an address and test pattern data to the memory device 100. The tester 101 provides the address to the memory cell array 120 via the address generator 110, and provides the test pattern data to the test pattern data register 140 via the data input buffer 150. Alternatively, the test pattern data register 140 may receive the test pattern data from the test mode setting register 130.

The test mode setting register 130 receives test operation commands from the tester 101 and generates a control signal for performing test operations responsive to the command. The test pattern data register 140 stores test pattern data responsive to the control signal.

The data multiplexer 160 multiplexes test pattern data from the test pattern data register 140, e.g., into four groups test pattern data, and provides the multiplexed data to the data input driver 170. The data input driver 170 provides multiplexed data to memory cell array 120 over global data lines GDL and local data lines LDL1~LDLn, where the local data lines LDL1~LDLn provide access to memory cell array 120 in response to the address from the address generator 110.

Output circuits 180-1, 180-2, 180-3 and 180-4 each receive the data from the memory cell array 120 over global data lines GDL and local data lines LDL1~LDLn, and the test pattern data from the test pattern data register 140. Each output circuit 180-1, 180-2, 180-3 and 180-4 inverts the test pattern data and determines a failure of at least one memory cell within the memory cell array responsive to the data, the test pattern data, and the inverted test pattern data. Although FIG. 1 shows four output circuits corresponding to the number of groups of multiplexed data, memory device 100 may include any number circuits and data groups.

Each of the data output circuits 180-1, 180-2, 180-3 and 180-4 includes sense amplifiers 181-1, 181-2, 181-3 and 181-4, and a decision circuit 182. The sense amplifiers 181-1, 181-2, 181-3 and 181-4 amplify data received over the global data lines GDL. The decision circuit 182 compares the amplified data a, b, c, and d from the sense amplifiers 181-1, 181-2, 181-3 and 181-4 with test pattern data A, B, C, and D from the test pattern data register 140 to determine whether at least one memory cell within the memory cell array 120 is faulty. Each data output circuit 180-1, 180-2, 180-3 and 180-4 provides failure data Z to the tester 101 via data output buffer 190. Although a 4-bit memory test is shown in FIG. 1, memory device 100 may perform the memory test with any number of bits.

Figure 2:
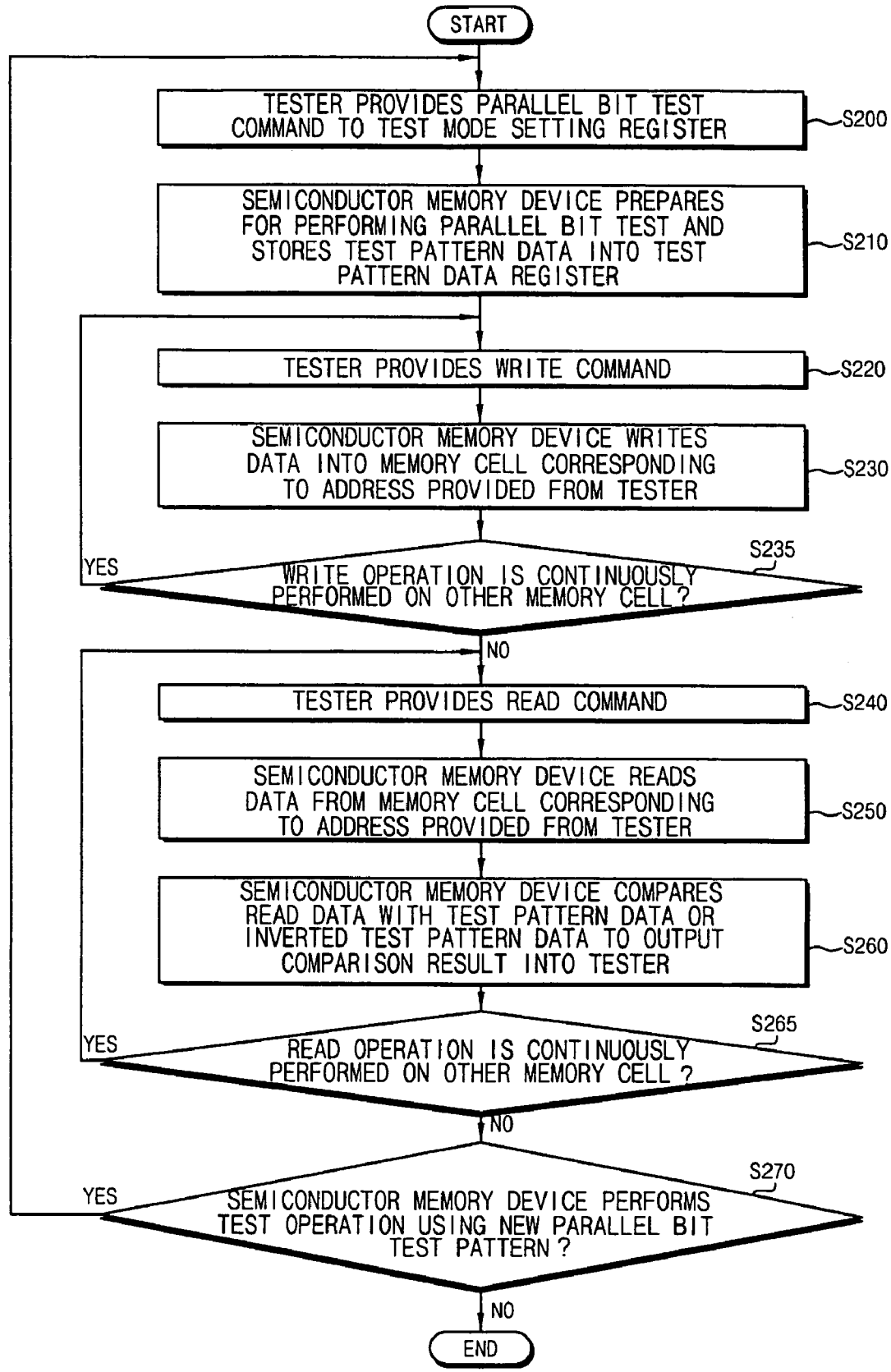
FIG. 2 is a flow chart illustrating a parallel bit test operation according to an embodiment of the present invention.

FIG. 2 is a flow chart illustrating a parallel bit test operation according to an embodiment of the present invention. Referring to FIG. 2, the tester 101 provides a parallel bit test command to a test mode setting register 130 in a memory device 100 (step S200). The parallel bit test command may be provided to the test mode setting register 130 by using MRS (Mode Register Set) signals.

The memory device 100 prepares for the parallel bit test by storing test pattern data in the test pattern data register 140 (step S210). The test pattern data register 140 may receive test pattern data from the test mode setting register 130 or the data input buffer 150.

Figure 3:
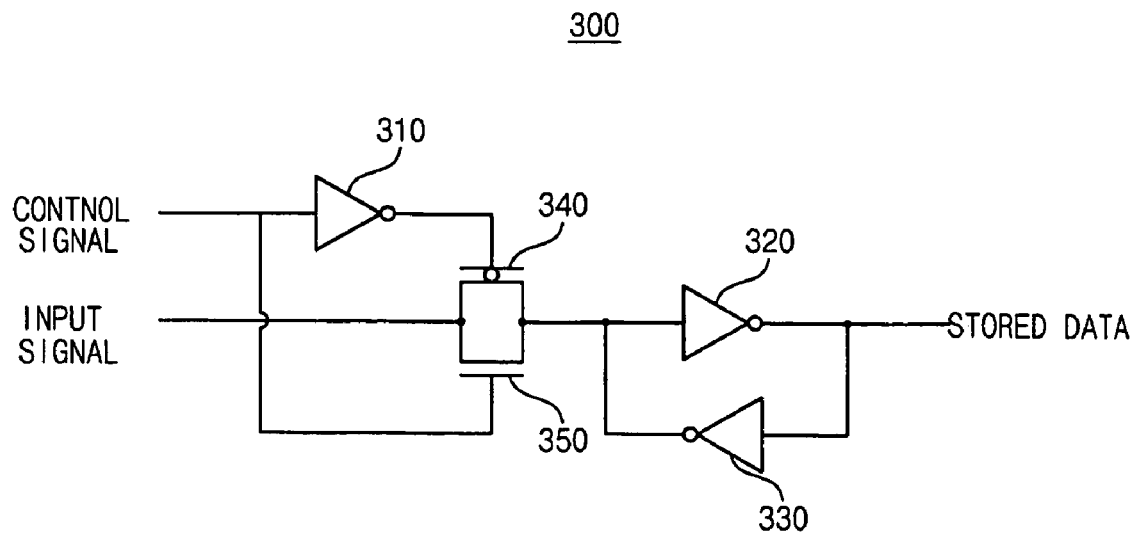
FIG. 3 is a circuit diagram illustrating an embodiment of the test pattern data register shown in FIG. 1.
Figure 4:
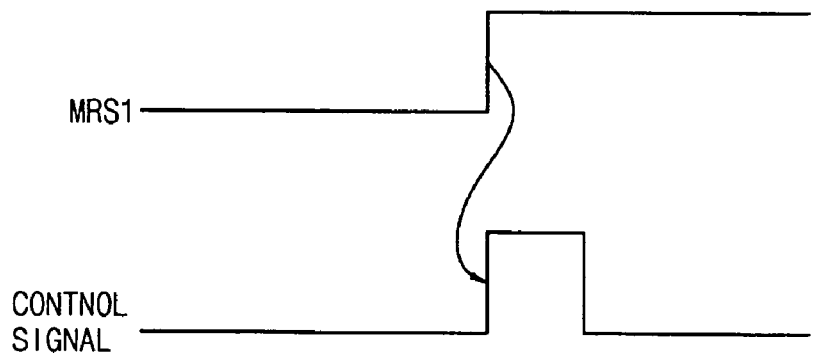
FIG. 4 is a timing diagram illustrating an embodiment of the control signal shown in FIG. 3.
Figure 5:
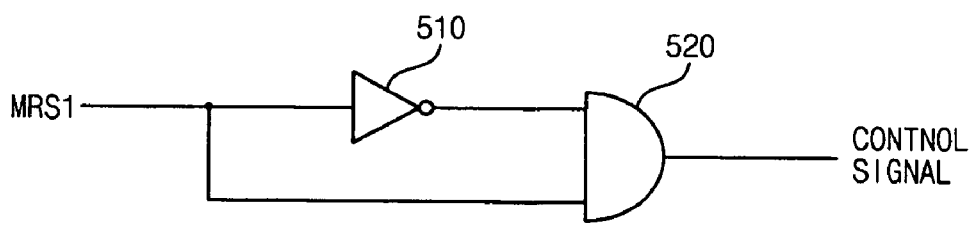
FIG. 5 is a circuit diagram illustrating an embodiment of a circuit for generating the control signal shown in FIG. 4.

The test pattern data register 140 may be implemented with a latch 300 as illustrated in FIG. 3. FIG. 3 is a circuit diagram illustrating an embodiment of the test pattern data register shown in FIG. 1. Referring to FIG. 3, a latch 300 latches an input signal responsive to a control signal. The latch 300 includes transistors 340 and 350, and inverters 310, 320 and 330. Inverter 310 inverts the control signal and provides the inverted signal to transistor 340. The control signal is also provided to the gate of transistor 350. Upon receipt of the control signal, latch 300 latches the input signal with transistors 340 and 350. After latching the input signal is provided to inverters 320 and 330, where the test pattern data is stored. The control signal may be generated in response to the MRS signals as shown in FIG. 4 and FIG. 5. Referring to FIG. 4 and FIG. 5, an MRS1 signal is provided to circuit 500 when at least one bit of the MRS signals indicates a parallel bit test command. The MRS1 signal is provided to an inverter 510 and AND logic 520, where the AND logic 520 logically ANDs the MRS1 signal and the result of the inverter 510. The result of the AND logic 520 is the control signal, where the width of a pulse in the control signal corresponds to the time delay of an inverter 510.

Referring back to FIG. 2, the tester 101 provides a write command to the memory device 100 (step S220), where the memory device 100 writes data into memory cell array 120 corresponding to the address provided from the tester 101 (step S230). The data written into the memory cells may be the test pattern data, the inverted test pattern data, or provided directly from the tester 101.

The tester 101 decides whether the memory device 100 should perform a similar write operation on other memory cells within the memory cell array (step S235). If additional write operations are to be performed, the process of the parallel bit test operation returns to the step S220, where the memory device 100 writes the data into the memory cell array 120. Otherwise, the process of the parallel bit test operation goes to step S240, where the tester 101 provides a read command to the memory device 100.

The memory device 100 reads data from the memory cell array 120 responsive to the read command and an address generated by an address generator 110 (step S250). The data read from the memory cell array 120 is provided to the sense amplifiers 181-1, 181-2, 181-3, and 181-4 via the global data line GDL and local data lines LDL1~LDLn. The sense amplifiers 181-1, 181-2, 181-3, and 181-4 may amplify the read data and provide the amplified data abcd to the decision circuit 182.

The decision circuit 182 tests the amplified data abcd responsive to the test pattern data ABCD from the test pattern data register 140, and provides the result Z to the tester 101, via the data output buffer 190 (step S260). The decision circuit 182 may invert the test pattern data ABCD and compare the amplified data abcd with both the inverted and non-inverted versions of the test pattern data ABCD.

The memory device 100 may perform the read operations on other memory cells (step S265). If additional read operations are to be performed, the process returns to the step S240, where data stored in the memory cell array 120 is read and compared with test pattern data. Otherwise, the process proceeds to step S270, where the tester 101 decides whether the memory device 100 performs test operations using new test pattern data (step S270). If the test operations using the new test pattern data are to be performed, the process returns to the step S200. Otherwise, the process ends.

Figure 6:
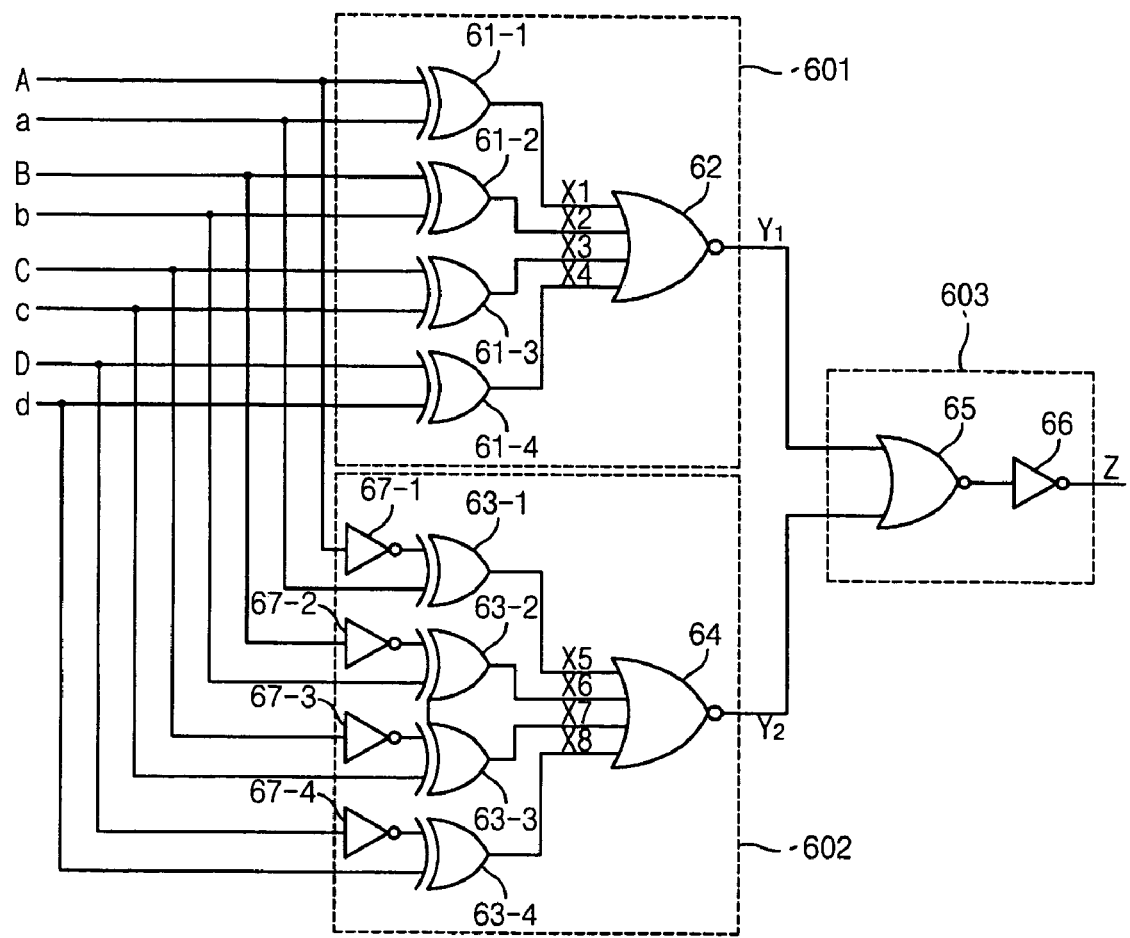
FIG. 6 is a circuit diagram illustrating an embodiment of the decision circuit shown in FIG. 1.

FIG. 6 is a circuit diagram illustrating an embodiment of the decision circuit shown in FIG. 1. Referring to FIG. 6, the decision circuit 182 includes a first comparator 601, a second comparator 602 and a combination circuit 603. The first comparator 601 compares the test pattern data ABCD stored in the test pattern data register 140 with the data abcd read from the memory cell array 120. The second comparator 602 inverts the test pattern data ABCD and compares the inverted test pattern data with the read data abcd. The combination circuit 603 generates a test result Z to indicate a failure in at least one memory cell within memory cell array 120 responsive to the comparisons by the first and second comparators 601 and 602.

The first comparator 601 includes bit comparators 61-1, 61-2, 61-3, and 61-4 and a bit combination circuit 62. Each bit comparator 61-1, 61-2, 61-3, and 61-4 compares a bit of the test pattern data ABCD with a corresponding bit of data abcd read from memory cell array 120. The bit combination circuit 62 generates a signal Y1 responsive to the bit comparisons X1, X2, X3, and X4 by comparators 61-1, 61-2, 61-3, and 61-4, respectively. The signal Y1 may indicate a failure in at least one memory cell within the memory cell array 120. The bit comparators 61-1, 61-2, 61-3, and 61-4 may be Exclusive-OR (XOR) gate logic, and the bit combination circuit 62 may be a NOR gate.

The second comparator 602 includes inverters 67-1, 67-2, 67-3, and 67-4, bit comparators 63-1, 63-2, 63-3, and 63-4, a bit combination circuit 64. The second comparator 602 operates similarly to the first comparator 601, except the test pattern data is inverted by inverters 67-1, 67-2, 67-3, and 67-4 prior to reception by bit comparators 63-1, 63-2, 63-3, and 63-4. The bit combination circuit 64 generates a signal Y2 responsive to the bit comparisons X5, X6, X7, and X8 by comparators 63-1, 63-2, 63-3, and 63-4. The signal Y2 may indicate a failure in at least one memory cell within the memory cell array 120. The bit comparators 63-1, 63-2, 63-3, and 63-4 may be Exclusive-OR (XOR) gate logic, and the bit combination circuit 64 may be a NOR gate. Although FIG. 6 shows the first comparator 601 and the second comparator 602 as Exclusive-OR gates (XOR) and a NOR gate, a person of skill in the art should recognize the comparators may be implemented by any number of circuits and/or logic.

The combination circuit 603 includes an inverter 66 coupled to a NOR gate 65. The NOR gate 65 receives logically NOR signals Y1 and Y2 from first and second comparators, respectively. The inverter 66 inverts the result from the NOR gate 65 and provides the result Z to the tester 101.

FIG. 7 is a truth table illustrating the operation of the decision circuit 182 shown in FIG. 6. Referring to FIG. 7, the truth table indicates whether a memory test has a PASS or FAIL result when the test pattern data ABCD is '0010'. A PASS result of a memory cell array 120 test indicates that no defective memory cells where detected and a FAIL result indicates that at least one defective memory cell within memory cell array 120 was detected. When the data abcd read from memory cell array 120 is '0010' or '1101', the read data abcd is the same as the test pattern data ABCD or an inverted version of the test pattern data, and thus a PASS result is indicated with an output Z of logic '1'. When the data abcd read from memory cell array 120 is '0001' or '0011', the read data abcd is different from the test pattern data ABCD or an inverted version of the test pattern data, and thus a FAIL result is indicated with an output Z of logic '0'.

While embodiments of the present invention and their advantages have been described in detail, it should be understood that various changes, substitutions and alterations may be made without departing from the spirit and scope of the invention.

I claim:

1. A device comprising:
   a memory cell array to store data;
   a register to store test data; and
   a decision circuit to invert the test data and to determine a failure of at least one memory cell within the memory cell array responsive to a comparison between the data and both of the test data and the inverted test data, where the decision circuit is operable to determine the failure responsive to a comparison of substantially all of the data stored in the memory cell array to the test data and responsive to a comparison of substantially all of the data stored in the memory cell array to the inverted test data, and the decision circuit includes:
   a first comparator to compare the data to the test data to generate a first result;
   a second comparator to compare the data to the inverted test data to generate a second result; and
   a combination circuit structured to combine the first result and the second result to generate a test signal indicating whether or not the memory cell array has at least one defective memory cell.

2. The device of claim 1 where the first comparator is operable to compare substantially all of the data stored in the memory cell array to the test data, where the second comparator is operable to invert the test data, and where the second comparator is operable to compare substantially all of the data stored in the memory cell array to the inverted test data.

3. The device of claim 1 where the memory cell array is operable to store the data responsive to a command from a tester.

4. The device of claim 3 where the data corresponds to the test data.

5. The device of claim 3 where the data corresponds to inverted test data.

6. The device of claim 1 where the register is operable to store test data from a tester.

7. The device of claim 1 where the memory cell array is operable to provide the data to the decision circuit responsive to a command from a tester.

8. The device of claim 1 where the decision circuit is adapted to indicate the failure to a tester.

9. A method comprising:
   storing test data in a register;
   storing data to a memory cell array;
   inverting the test data from the register; and
   determining a failure of at least one memory cell within the memory cell array responsive to a comparison between the data and both of the test data and the inverted test data where the determining includes:
   comparing substantially all of the data stored in the memory cell array to the test data to generate a first result;
   comparing substantially all of the data stored in the memory cell array to the inverted test data to generate a second result; and
   combining the first result and the second result to generate a test result indicating whether or not the memory cell array has at least one defective memory cell.

10. The method of claim 9 where the determining includes determining the failure responsive to comparing substantially all of the data stored in the memory cell array to the test data and responsive to comparing substantially all of the data stored in the memory cell array to the inverted test data.

11. The method of claim 9 where storing the data to the memory cell array is performed responsive to a command from a tester.

12. The method of claim 9, further comprising reading data from the memory cell array, where the reading is performed responsive to a command from a tester.

13. The method of claim 9, further comprising indicating the failure to a tester.

14. A device comprising:
    a memory cell array to store data;
    a test pattern register to store test pattern data;
    a plurality of data output circuits, each output circuit electrically coupled to the memory cell array and the test pattern register, each output circuit comprising:
    a plurality of sense amplifiers structured to receive and amplify the data stored in the memory cell array; and
    a decision circuit structured to receive the data from the memory cell array and the test pattern data from the test pattern register, the decision circuit comprising a first comparator, a second comparator, and a combination circuit, the first comparator structured to compare the data to the test pattern data using a first plurality of logic gates to generate a first result, the second comparator structured to compare the data to inverted test pattern data using a second plurality of logic gates to generate a second result, the combination circuit structured to combine the first result and the second result to generate a test result signal to indicate whether or not the memory cell array has at least one defective memory cell.

15. The device of claim 14 wherein:
    the second comparator includes a plurality of inverters to invert the test pattern data received from the test patter register;
    the first plurality of logic gates includes first bit comparators coupled to a first bit combination circuit, the first bit comparators are structured to receive and compare individual bits of the data to the test pattern data, and the first bit combination circuit is structured to receive bit comparisons from the first bit comparators to generate the first result; and the second plurality of logic gates includes second bit comparators coupled to a second bit combination circuit and the plurality of inverters, the second bit comparators are structured to receive the inverted test pattern data from the plurality of inverters, to compare individual bits of the data to the inverted test pattern data, and the second bit combination circuit is structured to receive bit comparisons from the second bit comparators to generate the second result.

16. The device of claim 15 wherein the first and second bit comparators comprise a plurality of exclusive-or gates, the first and second bit combination circuits each comprise a single NOR gate, and the combination circuit includes a NOR gate and an inverter.

* * * * *